United States Patent [19]

Burrus, Jr. et al.

[11] Patent Number: 4,528,670

[45] Date of Patent: Jul. 9, 1985

[54] SHORT COUPLED CAVITY LASER

[75] Inventors: Charles A. Burrus, Jr., Fair Haven; Chinlon Lin, Holmdel, both of N.J.

[73] Assignee: AT&T Bell Laboratories, Murray Hill, N.J.

[21] Appl. No.: 469,813

[22] Filed: Feb. 25, 1983

[51] Int. Cl.³ .............................................. H01S 3/19
[52] U.S. Cl. ...................................... 372/44; 372/19; 372/92
[58] Field of Search ....................... 372/44, 50, 92, 19

[56] References Cited

PUBLICATIONS

Kanada et al., "Single-Mode Operation of a Modulated Laser Diode with a Short External Cavity", *Optics Communications,* vol. 31, No. 1, Oct. 1979, pp. 81–84.
Bessonov et al., "Injection Heterolaser with a Short Resonator", *Sov. J., Quantum Electron,* 9(2), Feb. 1979, pp. 243–245.
"Discrimination . . . Fabry–Perot Resonator", BSTJ, vol. 41, p. 453, by D. A. Kleinman, et al., dated (1961).
"Single-Mode . . . Hemispherical Resonators", Opt. Commun., vol. 13, No. 2, Feb. 1975, by C. Voumard et al., p. 130.
"Resonance . . . External Resonators", Appl. Phys. 12, by C. Voumard et al., p. 369.

*Primary Examiner*—James W. Davie
*Attorney, Agent, or Firm*—Gregory C. Ranieri; Bernard Tiegerman

[57] ABSTRACT

Single longitudinal mode operation is achieved and maintained under CW and high speed (Gbps) current modulation conditions by a short coupled cavity laser including a short cavity semiconductor laser having two parallel mirror facets and a reflective surface spaced apart from and in predetermined relationship with one of the mirror facets. A short external cavity resonator is formed between the one mirror facet and the reflective surface. In general, the laser cavity length is related to the external cavity resonator length by the equation, $nL = md$, where $nL$ is the effective optical length of the injection laser, $d$ is the length of the external cavity resonator, and $m$ is a positive number preferably between 2 and 10.

11 Claims, 5 Drawing Figures

SHORT COUPLED CAVITY LASER

TECHNICAL FIELD

This invention relates to the field of semiconductor lasers and, more particularly, to CW and high speed, single longitudinal mode operation of a short coupled cavity laser.

BACKGROUND OF THE INVENTION

Operational characteristics of injection lasers under high speed modulation are of interest in optical fiber communication systems. Characteristics which are of particular interest for wideband single longitudinal mode fiber transmission are dynamic spectral behaviors such as frequency chirping and transient gain peak shifting in the transient regime and spectral envelope broadening at the occurrence of multiple longitudinal modes. Control of these dynamic spectral characteristics and others are important to achieving sufficient mode selection for single longitudinal mode operation under high speed operation.

Several approaches are known for achieving longitudinal mode selection in lasers. The approaches, excluding the use of a built-in grating for feedback, are as follows: short cavity laser, external cavity laser, and two-section (coupled cavity) laser. Each approach is described in more detail below.

Short cavity lasers employ an optical cavity which has a cavity length of approximately 30 to 80 microns. This cavity length is at least five or six times shorter than conventional optical cavity lengths. Mode selectivity of the short cavity laser arises from a much larger longitudinal mode separation and a larger gain difference between adjacent modes than in conventional lasers. Short cavity lasers are described in articles by T. P. Lee et al., *IEEE J. Quantum Electron.*, QE-18, p. 1101 (1982), and C. A. Burrus et al., *Electron. Lett.*, Vol. 17, p. 954 (1981).

External cavity lasers are comprised of a combination of a long optical cavity, cleaved laser and an external reflector. The reflector and a cleaved facet of the laser form an external cavity resonator which is, in general, approximately as long as the optical cavity of the laser. Diffraction losses occur in the external cavity resonator because the propagation medium is air. Mode selectivity of this combination arises from modulation of the loss in the coupled resonator including the laser and the external cavity resonator as a function of frequency. External cavity lasers have been described in articles by K. R. Preston et al., *Electron. Lett.*, Vol. 17, p. 931 (1981); D. Renner et al., *Electron. Lett.*, Vol. 15, p. 73 (1979); C. Voumard et al., *Opt. Commun.*, Vol. 13, p. 130 (1975); and D. A. Kleinman et al., *BSTJ*, Vol. 41, p. 453 (1962).

Two section and other multiple section lasers employ a corresponding number of monolithic laser cavities abutting each other. In this type of laser, the cavities are waveguiding regions which are controllable via current biasing. In general for two-section lasers, the sections are comprised of a long section and a short section. Mode selectivity results from modulation of the loss of the laser cavities as a function of frequency. Multiple section lasers have been described in U.S Pat. No. 3,303,431 issured to A. B. Fowler on Feb. 7, 1967 and in articles by L. A. Coldren et al., *Appl. Phys. Lett.*, Vol. 38, p. 315 (1981); K. J. Ebeling et al., *Electron. Lett.*, Vol. 18, p. 901 (1982); Coldren et al., *IEEE J. Quantum Elect.*, QE-18, p. 1679 (1982).

In all of the lasers categorized above, there exist problems in achieving efficient single longitudinal mode operation under high speed modulation conditions because of dynamic spectral characteristics of the lasers.

SUMMARY OF THE INVENTION

Single longitudinal mode operation is achieved and maintained under CW and high speed (gigahertz) modulation conditions by a short coupled cavity laser including a short cavity semiconductor laser having two parallel mirror facets and a reflective surface spaced apart from and in predetermined relationship with one of the mirror facets. An external cavity resonator is formed between the one mirror facet and the reflective surface.

In one embodiment of the invention a III-V heterostructure injection laser having a cavity length between 50 and 80 microns is coupled to a short external cavity resonator having a length between 30 and 80 microns. The short external cavity resonator includes one cleaved facet of the injection laser and reflective surface spaced apart from and facing the cleaved facet. In general, the laser cavity length is related to the external cavity resonator length by the equation, $nL = md$, where $nL$ is the effective optical length of the injection laser, $n$ is the index of refraction of the guiding region of the injection laser at the wavelength of interest, $L$ is the physical length of the injection laser, $d$ is the length of the external cavity resonator, and $m$ is a positive number preferably between 2 and 10.

BRIEF DESCRIPTION OF THE DRAWINGS

A more complete understanding of the invention may be obtained by reading the following description of a specific illustrative embodiment of the invention in conjunction with the appended drawing in which.

DETAILED DESCRIPTION

Figure 1:
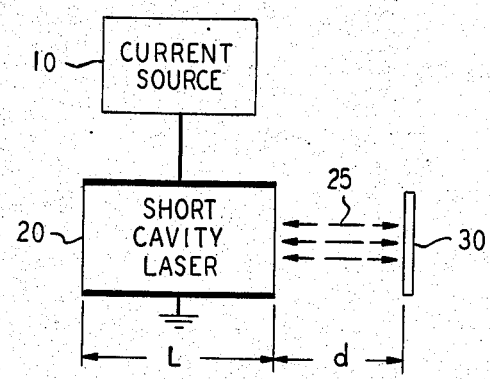
FIG. 1 is a simplified block diagram of a short coupled cavity laser formed in accordance with the present invention.
Figure 5:
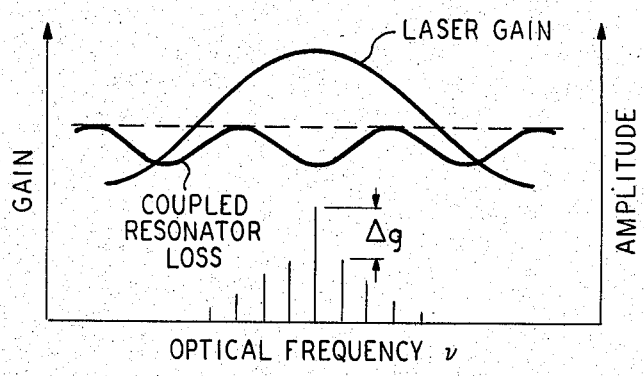
FIG. 5 shows graphically the contribution of components of the short coupled cavity laser, which is formed in accordance with the present invention, to its output mode spectrum at threshold.

As shown in FIGS. 1 and 5, the present invention is a coupled short cavity laser for achieving and maintaining single longitudinal mode operation under both CW and high speed modulation conditions. While the following description shows the preferred use of current injection for exciting the laser, it should be obvious to those skilled in the art that optical sources are capable of being utilized for pumping the laser.

The short coupled cavity laser is illustrated in simplified block diagram form in FIG. 1. In accordance with the present invention, the short coupled cavity laser includes current source 10, short cavity laser 20, and reflective surface 30. Current source 10 provides current to pump the active region of short cavity laser 20. Short cavity laser 20 is typically a short cavity, semiconductor laser having an effective optical length nL, where n is the index of refraction of the guiding region of short cavity laser 20 at the wavelength of interest and L is the physical length of short cavity laser 20. Light quanta 25 are generated by short cavity laser 20 and exit through one of two parallel mirror facets of short cavity laser 20 toward reflective surface 30. Reflective surface 30 is spaced apart from and appropriately positioned with respect to one mirror facet of short cavity laser 20 so that at least a portion of light quanta 25 is reflected back toward short cavity laser 20. One facet of short cavity laser 20 and reflective surface 30 form an external cavity resonator of length d. External cavity resonator length d is related to the effective optical length of short cavity laser 20 by the following equation, $nL = md$, where m is a positive number. Optimization of a value and range of value for m is described below in more detail. It should be clear to those skilled in the art that reflective surface 30 and both facets of short cavity laser 20 form a coupled resonator.

Cleaved facet, stripe geometry, InGaAsP/InP double heterostructure injection lasers are adaptable for use as short cavity laser 20. Other Group III-V semiconductor lasers having cleaved or etched facets are also suitable for use as short cavity laser 20. For purposes of illustration and not for purposes of limitation, exemplary types of short cavity lasers are stripe geometry, v-groove (buried crescent), ridge and various buried heterostructure lasers from the InP or GaAs alloys and their derivatives. Regardless of the type of laser selected as short cavity laser 20, it should be noted that the laser cavity length L is less than 100 microns and preferably between 50 and 80 microns.

Reflective surface 30 is realized by forming a highly reflective material into or on a planar or curved shape. In one example, gold is evaporated onto a cleaved facet of semiconductor material to form a flat (planar) reflective surface 30. Other exemplary reflective surfaces are formed by coating one end of an optical fiber with reflective material or by fabricating spherical or parabolic or other concave surfaces with high reflectivity. Reflective surface 30 is aligned, in the case of a flat reflective surface, normal to the longitudinal axis of light quanta 25. That is, the flat reflective surface is substantially parallel to the external mirror facet of short cavity laser 20. It is desirable to permanently mount reflective surface 30 on the same platform or substrate as short cavity laser 20.

In the short coupled cavity laser, good longitudinal mode selection is achieved by employing the largest and steepest modulation of the resonator loss as a function of frequency because this tends to maximize the loss difference between adjacent modes. If the gain peak of short cavity laser 20 is positioned near a loss minimum, the corresponding mode oscillates strongly while nearby modes are suppressed. In general, these characteristics are controlled by choosing a suitable value for m or, alternatively, by properly designing the length of the external cavity resonator.

A small value for m, such a 2 or 3, results in a loss modulation period of every two or three modes with a substantially large modulation slope. But, it should be noted that there may be several modulation periods under the gain curve for short cavity laser 20 which would cause oscillation of several distant modes. On the other hand, a large value for m, such as 10 or 12, guarantees that there is only one modulation period under the gain curve for short cavity laser 20. In this case, the resulting modulation slope is small, thereby increasing the possibility of oscillation in adjacent modes along with the dominant, minimum loss mode. In light of the above considerations, the value of m is between 2 and 10 and preferably between 3 and 8 depending upon operating conditions and the envelope of the gain curve for short cavity laser 20. Hence, the desired length of the external cavity resonator is less than 100 microns and preferably between 30 and 80 microns. While variations of either the external cavity resonator length d or the short cavity laser length L may be necessary for different applications, the combined lengths of the external cavity resonator and the short cavity laser, i.e., $d + L$, should be less than 200 microns.

Figure 2:
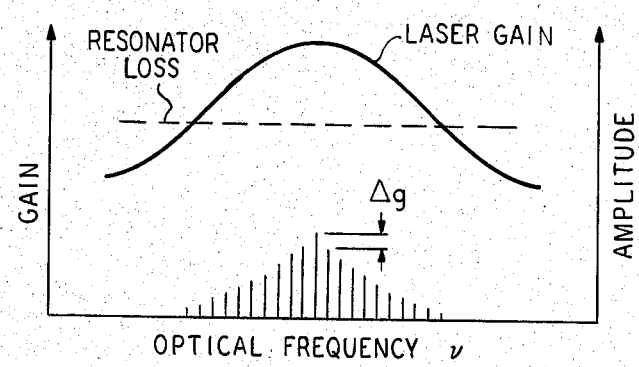
FIG. 2 shows graphically the contribution of components of a conventional long cavity laser to its output mode spectrum at threshold.
Figure 3:
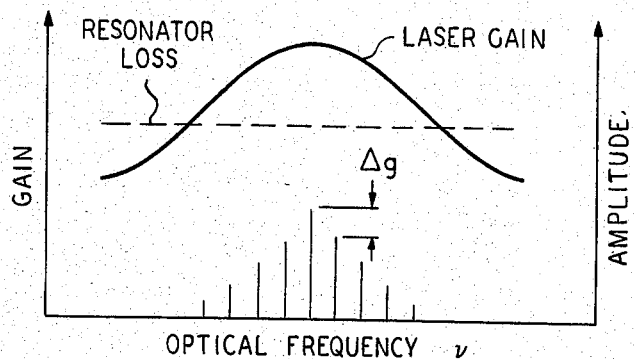
FIG. 3 shows graphically the contribution of components of a short cavity laser to its output mode spectrum at threshold.
Figure 4:
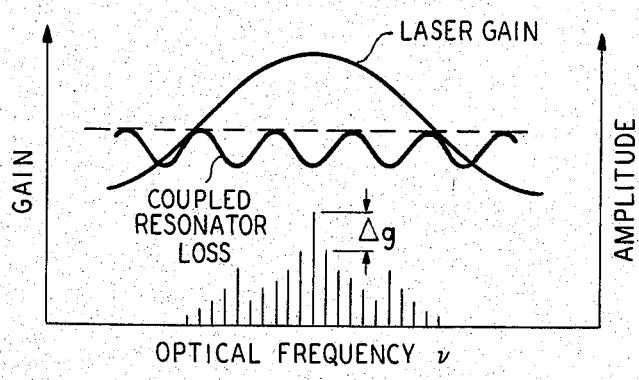
FIG. 4 shows graphically the contribution of components of a conventional external cavity laser to its output mode spectrum at threshold.

FIGS. 2 through 5 illustrate progressive improvements in single longitudinal mode operation realized in going from a conventional long cavity laser (several hundred microns in length) in FIG. 2 to a short cavity laser in FIG. 3 and then to a conventional external cavity laser (conventional long cavity laser coupled to an external cavity resonator) in FIG. 4 and finally to the short coupled cavity laser in FIG. 5 of the present invention. As shown in these FIGURES, the laser gain curves are substantially identical regardless of the type of laser, i.e., long or short cavity. Moreover, in FIGS. 4 and 5, the coupled resonator loss curves have been drawn in position relative to a fixed reference line (dashed line in FIGS. 2–5) and the period of each coupled resonator loss curve is determined by selecting m equal to 6, for example. $\Delta g$ represents the net gain or amplitude difference between the center mode and the adjacent mode. The longitudinal mode spectra as shown in FIGS. 2 through 5 illustrate output amplitude versus optical frequency variations for each particular laser operating near threshold.

Effective mode suppresion is dependent upon $\Delta g$. For the short coupled cavity laser, $\Delta g$ is large thereby allowing strong oscillation of the dominant central mode while suppressing all other modes during above-threshold operation. From experimental practice, CW operation of the short coupled cavity laser at approximately 1.4 times threshold result in more than 20 dB mode suppression, i.e., single longitudinal mode operation.

What is claimed is:

1. In combination, a short cavity semiconductor laser having first and second substantially parallel facets for generating coherent light quanta in response to an applied signal, the light quanta exiting at least the first facet of the laser, and a reflective surface spaced apart from and in predetermined relationship with the first facet of the laser, so that the reflective surface and the first facet form an external cavity resonator therebetween, the short cavity semiconductor laser and the external cavity resonator have a combined length less than about 200 microns.

2. The combination as defined in claim 1 wherein the external cavity resonator has a length d less than 100 microns.

3. The combination as defined in claim 2 wherein the external cavity resonator length d is between 30 microns and 80 microns.

4. The combination as defined in claim 1 wherein the short cavity semiconductor laser has a length L less than 100 microns.

5. The combination as defined in claim 4 wherein the length L is between 50 and 80 microns.

6. The combination as defined in claim 1 wherein the short cavity semiconductor laser has an effective optical length nL, the external cavity resonator has a length d, and both of the lengths are related as nL is substantially equal to md, where m is a positive number between 2 and 10.

7. In a coupled cavity laser, a semiconductor laser having first and second substantially parallel facets for generating light quanta in response to an applied signal, the light quanta exiting the first facet if the laser, and a reflective surface spaced apart from and in predetermined relationship with the first facet of the semiconductor laser, so that the reflective surface and the first facet form an external cavity resonator therebetween, the coupled cavity laser being characterized in that,
a combined length of said semiconductor laser and the external cavity resonator is less than 200 microns.

8. The coupled cavity laser as defined in claim 7 wherein the external cavity resonator has a length between 30 and 80 microns.

9. The coupled cavity laser as defined in claim 7 wherein the semiconductor laser has an effective optical length nL, the external cavity resonator has a length d, and both of the lengths are related as nL being substantially equal to md, where m is a positive number between 2 and 10.

10. The coupled cavity laser as defined in claim 7 wherein the semiconductor laser has a length L less than 100 microns.

11. The coupled cavity laser as defined in claim 10 wherein the length L is between 50 and 80 microns.

* * * * *